(12) United States Patent
Voigt et al.

(10) Patent No.: US 9,157,776 B2
(45) Date of Patent: Oct. 13, 2015

(54) MAGNETO INDUCTIVE, FLOW MEASURING DEVICE

(75) Inventors: Frank Voigt, Weil am Rhein (DE); Gunther Bahr, Therwil (CH); Diego Uerlings, Grenzach-Wyhlen (DE); Werner Wohlgemuth, Seeven (CH)

(73) Assignee: Endress + Hauser Flowtec AG, Reinach (CH)

( * ) Notice: Subject to any disclaimer, the term of this patent is extended or adjusted under 35 U.S.C. 154(b) by 80 days.

(21) Appl. No.: 14/232,976

(22) PCT Filed: Jun. 5, 2012

(86) PCT No.: PCT/EP2012/060552
§ 371 (c)(1),
(2), (4) Date: Jan. 15, 2014

(87) PCT Pub. No.: WO2013/010715
PCT Pub. Date: Jan. 24, 2013

(65) Prior Publication Data
US 2014/0150567 A1   Jun. 5, 2014

(30) Foreign Application Priority Data

Jul. 18, 2011   (DE) .......................... 10 2011 079 351

(51) Int. Cl.
*G01F 1/58* (2006.01)
*H05K 13/00* (2006.01)

(52) U.S. Cl.
CPC   *G01F 1/58* (2013.01); *G01F 1/586* (2013.01); *G01F 1/588* (2013.01); *H05K 13/00* (2013.01); *Y10T 29/4902* (2015.01)

(58) Field of Classification Search
CPC .............. G01F 1/58; G01F 1/60; G01F 1/716
USPC .............................. 73/861.12, 861.16, 861.08
See application file for complete search history.

(56) References Cited

U.S. PATENT DOCUMENTS

| 2,734,380 | A |   | 2/1956 | Mittelmann |
| 4,281,552 | A | * | 8/1981 | Nissen et al. ............... 73/861.12 |
| 4,641,537 | A | * | 2/1987 | Hansen et al. ............. 73/861.12 |
| 4,679,442 | A |   | 7/1987 | Kubota |
| 4,932,268 | A | * | 6/1990 | Hafner ........................ 73/861.12 |

(Continued)

FOREIGN PATENT DOCUMENTS

| DE |  3545155 A1 | 7/1986 |
| DE | 19958285 A1 | 6/2001 |

(Continued)

OTHER PUBLICATIONS

English translation of IPR, WIPO, Geneva, Jan. 30, 2014.

(Continued)

*Primary Examiner* — Jewel V Thompson
(74) *Attorney, Agent, or Firm* — Bacon & Thomas, PLLC

(57) ABSTRACT

A magneto inductive flow measuring device having a measuring tube and at least one magnet system arranged on the measuring tube, wherein the measuring tube has at least one planar area and an otherwise cylindrical lateral surface, which border the measuring tube from its environment, against which planar area the magnet system is prestressed The magnet system is prestressed against the planar area of the measuring tube by means of a screwed connection between measuring tube and magnet system and/or the magnet system is prestressed against the planar area of the measuring tube by means of a mounting clip, which is secured shape-interlocked to the measuring tube. A method for manufacturing the magneto inductive, flow measuring device is also discussed.

14 Claims, 4 Drawing Sheets

(56) References Cited

U.S. PATENT DOCUMENTS

| | | | |
|---|---|---|---|
| 5,544,532 A * | 8/1996 | Brown | 73/861.16 |
| 5,751,535 A | 5/1998 | Garcia-Gutierrez | |
| 6,453,756 B2 | 9/2002 | Willigen | |
| 7,124,645 B2 | 10/2006 | Huybrechts | |
| 2004/0149046 A1 | 8/2004 | Yamazaki | |
| 2009/0025486 A1 | 1/2009 | Cros | |

FOREIGN PATENT DOCUMENTS

| | | |
|---|---|---|
| DE | 10306522 A1 | 8/2004 |
| DE | 102007029563 A1 | 1/2009 |
| DE | 102007061798 A1 | 6/2009 |
| EP | 0990876 A1 | 4/2000 |
| EP | 1522828 A1 | 4/2005 |
| EP | 1674836 A1 | 6/2006 |
| EP | 2019294 A1 | 1/2009 |

OTHER PUBLICATIONS

German Search Report, German PTO, Munich, Mar. 22, 2012.
International Search Report, EPO, The Netherlands, Oct. 22, 2012.

* cited by examiner

MAGNETO INDUCTIVE, FLOW MEASURING DEVICE

TECHNICAL FIELD

The present invention relates to a magneto inductive, flow measuring device having a measuring tube and at least one magnet system arranged on the measuring tube.

BACKGROUND DISCUSSION

Magneto inductive flow measuring devices utilize the principle of electrodynamic induction for volumetric flow measurement are known from a large number of publications. Charge carriers of the medium moved perpendicularly to a magnetic field induce a measurement voltage in measuring electrodes arranged essentially perpendicularly to the flow direction of the medium and perpendicularly to the direction of the magnetic field. The measurement voltage induced in the measuring electrodes is proportional to the flow velocity of the medium averaged over the cross section of the measuring tube, and is, thus, proportional to the volume flow rate. If the density of the medium is known, the mass flow in the pipeline, respectively in the measuring tube, can be determined. The measurement voltage is usually registered across a measuring electrode pair, which is arranged relative to the coordinate along the measuring tube axis in the region of maximum magnetic field strength and where, thus, the maximum measurement voltage is to be expected. The electrodes are usually galvanically coupled with the medium; there are, however, also magneto inductive, flow measuring devices with contactless, capacitively coupling electrodes.

The measuring tube can, in such case, be manufactured either from an electrically conductive, non-magnetic material, e.g. stainless steel, or from an electrically insulating material. If the measuring tube is manufactured from an electrically conductive material, then it must be lined in the region coming in contact with the medium with a liner of an electrically insulating material. The liner is composed, depending on temperature and medium, for example, of a thermoplastic, a thermosetting or an elastomeric, synthetic material, or plastic. There are, however, also magneto inductive, flow measuring devices, which have a ceramic lining.

Known from published application US 2004/0149046 A1 is an electromagnetic flow measuring device having a measuring tube, which has a planar area and an otherwise cylindrical surface. Arranged on the planar area is a pole shoe of a magnet system. In such case, the pole shoe, the inner core and the coil are secured on an outer core (for flux guide back) by a screwed connection against slipping. Unfavorable in the case of this embodiment is the conventional flush, shape interlocking bearing of the pole shoe on the measuring tube, since this places high requirements on tolerances. Problematic is the mechanically little stable affixing of the pole shoe on the measuring tube only via the external core. This can lead in the case of vibrations to a degrading of the measurement signal.

U.S. Pat. No. 2,734,380 discloses a magnetic flow measuring device having a measuring tube, in the case of which the pole shoes of two magnet coils lie on a flat area. The two magnet cores are affixed on the measuring tube by externally situated bolts (126 in the patent, FIG. 3). Disadvantageous in the case of this embodiment is that several bolts are necessary and that, in the case of a non-symmetric tightening torque, additional measurement deviations can occur.

European Patent No. EP 1 674 836 A1 discloses a magneto inductive, flow measuring device with a coil and at least two components connected releasably with one another, wherein the component lies flat on a region of a right angled measurement line and is held by an external tube on this measurement line. Tolerances in the outer diameter of the measuring tube are compensated, in such case, by a flexible piece of sheet metal, which presses the core and, via the core, the pole shoe against the measuring tube. Disadvantageous in the case of this embodiment is that the force, with which the sheet metal presses on the core, is relatively small due to the thinness of the sheet metal, a feature which can disadvantageously influence the sensitivity of the measuring device and its stability e.g. in the case of vibrations.

U.S. Pat. No. 5,751,535 discloses an electronic flow measuring device having a cylindrical measuring tube and pole shoes of a magnet bearing thereon. Disadvantageous in the case of these variants of embodiment are especially the pole shoe angle, which depends on the tube tolerances, since the bearing points are not defined via a planar, machined area, but, instead, via the contact of the pole shoes on the periphery of the measuring tube. Depending on diameter or deviation from ideal roundness of the measuring tube, the bearing points of the pole shoe change on the measuring tube. When, in the mounting, the pole shoe is pressed against the measuring tube, the legs bend dependent on the measuring tube geometry and the applied force. This can lead to an additional measurement deviation.

German Patent No. DE 103 06 522 discloses a system for the efficient and guided mounting and affixing of a magnet system on a pipe of rather small diameter. This is especially achieved by an advantageous shaping of the coil form, the coil core and the field guide-back path, and is less advantageous in the case of greater tube diameters.

German Patent No. DE 35 45 155 discloses, among others things, the affixing of a magnet system on a housing composed of a number of parts, instead of directly on the measuring tube (see FIG. 3 in the patent). Disadvantageous here is that, depending on the dimensions and tolerances of the components, a separation between pole shoe and measuring tube can occur or the housing does not fit over the core.

An electrode can be subdivided essentially into an electrode head, which comes in contact at least partially with a medium flowing through the measuring tube, and an electrode shaft, which is situated almost completely in the wall of the measuring tube.

The electrodes are, besides the magnet system, the central components of a magneto inductive, flow measuring device. In the embodiment and arrangement of the electrodes, attention is to be paid that they can be assembled in the measuring tube as simply as possible and that subsequently in measurement operation no sealing problems occur; moreover, the electrodes should provide a sensitive and simultaneously low-disturbance, registering of the measurement signal.

Besides the measuring electrodes, which serve for registering a measurement signal, often additional electrodes are installed in the measuring tube in the form of reference- or grounding electrodes. These serve to measure an electrical reference potential or to detect partially filled measuring tubes or to register the temperature of the medium by means of an installed temperature sensor.

SUMMARY OF THE INVENTION

An object of the invention is to provide a simple and cost effectively manufactured, magneto inductive, flow measuring device.

The object is achieved by a magneto inductive flow measuring device, comprising: a measuring tube; and at least one magnet system arranged on said measuring tube, wherein: said measuring tube has at least one planar area and an otherwise cylindrical lateral surface, which border said measuring tube from its environment, against which planar area said magnet system is prestressed; said magnet system is prestressed against said planar area of said measuring tube by means of a screwed connection between said measuring tube and said magnet system and/or said magnet system is prestressed against said planar area of said measuring tube by means of a mounting clip, which is secured shape-interlocked to said measuring tube; and by a method for manufacturing a magneto inductive, flow measuring device comprising: a measuring tube; and at least one magnet system arranged on said measuring tube, wherein: said measuring tube has at least one planar area and an otherwise cylindrical lateral surface, which border said measuring tube from its environment, against which planar area said magnet system is prestressed; said magnet system is prestressed against said planar area of said measuring tube by means of a screwed connection between said measuring tube and said magnet system and/or said magnet system is prestressed against said planar area of said measuring tube by means of a mounting clip, which is secured shape-interlocked to said measuring tube, comprising the steps of: providing a measuring tube having a circularly cylindrical shaped lateral surface is provided with a planar area, against which a magnet system is prestressed; prestressing the magnet system against the planar area of the measuring tube by means of a screwed connection between measuring tube and magnet system; and/or presstressing the magnet system against the planar area of the measuring tube by means of a mounting clip, which is secured shape-interlocked to the measuring tube.

BRIEF DESCRIPTION OF THE DRAWINGS

The invention permits numerous forms of embodiment. Some thereof will now be explained in greater detail based on the appended drawing, the figures of which show as follows, wherein equal elements are provided with equal reference characters.

DETAILED DISCUSSION IN CONJUNCTION WITH THE DRAWINGS

Figure 1:
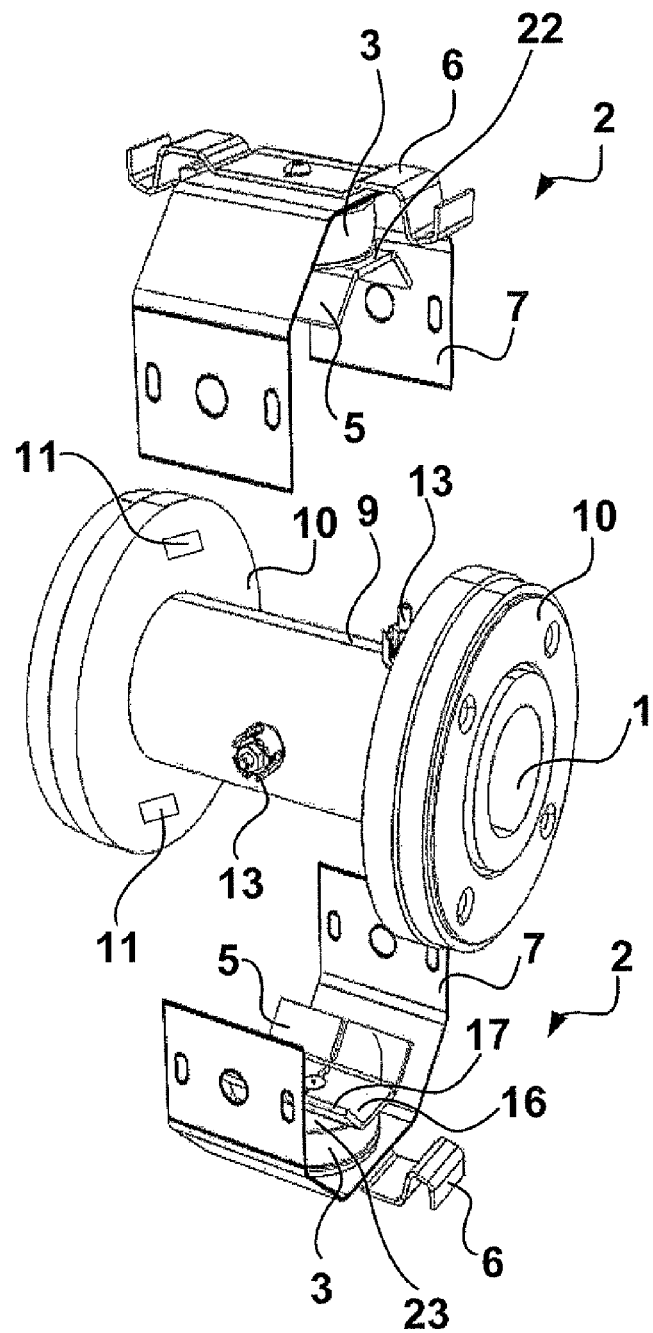
FIG. 1 shows perspectively, a magneto inductive, flow measuring device of the invention before the mounting of the magnet system.

FIG. 1, shows perspectively, individual assemblies of a magneto inductive, flow measuring device of the invention. A measuring tube 1 includes a planar area 9 on an otherwise circularly cylindrical, lateral surface, and an essentially circularly shaped, inner diameter. Measuring tube 1 is provided with this planar area 9, for example, by material removal, e.g. by milling material from the tube, or it can be originally so formed, e.g. cast, with the planar area 9. Especially, the measuring tube 1 has an otherwise circularly shaped cross section with a removed circular segment, with the cross section of the planar area 9 as the chord limiting the circular segment. The lateral surface and the planar area 9 border the measuring tube externally from its environment.

Measuring tube 1 includes, here, end flanges 10. Placed in the measuring tube wall are, moreover, electrodes 13 and 15. In an example of an embodiment of the invention, the electrodes 13 and 15 contact the measured material in the measuring tube 1. The electrode 15 protrudes, in such case, outwardly from the planar area 9 of the measuring tube 1. This serves, for example, as a measured material monitoring electrode.

A second assembly is formed by a magnet system 2. Such includes a pole shoe 5 and a coil 3. Included supplementally here are a curved piece of sheet metal, in the form of field guide-back 7, and a mounting clip 6. The magnet system 2 is described in detail in the description for FIG. 2. It is, for example, arranged on the measuring tube 1 by being superimposed on the planar area 9 and held pressed thereon with a predetermined force, such that it is, according to the invention, prestressed against the planar area 9.

In the shown further development, the magnet system 2 is prestressed against the planar area 9 of the measuring tube 1 by means of the mounting clip 6. Mounting clip 6 is here shape-interlocked with the flange 10 of the measuring tube 1. In this regard, flange 10 includes a cavity 11, in which the mounting clip 6 engages.

Mounting clip 6 is, thus, shape-interlocked with the measuring tube 1, here with its flanges 10, and the magnet system 2 is connected with the measuring tube 1 by force interlocking, e.g. friction interlocking. Mounting clip 6 includes, in such case, a predetermined elasticity. It serves as a resilient clamping element.

In the shown example of an embodiment, the force flux of the compressive force extends from the mounting clip 6 via the coil core 4 of the coil 3 and the pole shoe 5 to the planar area 9 of the measuring tube 1. Arranged supplementally between mounting clip 6 and coil 3 is the field guide-back 7, through which the force is led. Mounting clip 6, field guide-back 7, coil 3 and pole shoe 5 are, in such case, connected with one another as an assembly via a screw 14. In an additional embodiment, the mounting clip 6 presses the coil core 4 of the coil 3 against the pole shoe 5 and this, thus, against the planar area 9 of the measuring tube 1.

Pole shoe 5, which is pressed against the planar area 9 of the measuring tube 1, is so formed, in such case, that it contacts the planar area 9 of the measuring tube 1 and has a predetermined minimum separation greater than zero from the otherwise cylindrical lateral surface of the measuring tube 1. In such case, it surrounds the measuring tube 1 in a circular arc angle of at least 10°, especially at least 30°, for example, even 60°. Here, the pole shoe 5 includes a first planar area 16, which lies on the planar area 9 of the measuring tube 1.

The first planar area 16 of the pole shoe 5 has here a width, which is greater than the width of the planar area 9 of the measuring tube 1. The widths are, in such case, measured parallel to the planar area 9 of the measuring tube 1 and orthogonally to the measuring tube axis of the measuring tube 1 projected into the planar area 9 of the measuring tube.

The pole shoe, in a here not shown form of embodiment of the invention, is allowed to contact the measuring tube also on its lateral surface outside the planar area, for example, to lie tangent to it on two lines extending parallel to the measuring tube axis and on different halves of the measuring tube, for example, in each case, once with each of its legs. However, the pole shoe, according to the invention, is not allowed to be deformed by the manner of its securement on the measuring tube, especially its shape must not be changed by mechanical stresses beyond a predetermined amount. Therefore, it is, according to the invention, prestressed with a predetermined, and therewith limited, force against the measuring tube. The force with which the magnet system, respectively the pole shoe, is prestressed on the planar area of the measuring tube, points perpendicularly onto the planar area of the measuring tube and amounts to, at most, 2000 N, especially, at most, 100 N. This is, naturally, dependent on the thickness of the pole shoe 5. Between pole shoe 5 and coil core 4 as well as between coil core 4 and field guide-back 7, there should be no air gaps, such as can form, for example, between pole shoe 5 and coil core 4 when the pole shoe 5 is deformed by supplementally bearing on the circularly cylindrical lateral surface of the measuring tube 1. Here, for this reason, the pole shoe 5 only contacts the planar area 9 of the measuring tube.

The force of the prestress is unimportant, when the coil core of the coil 3 has a contour complementary to that of the pole shoe 5 in the mounted state. The coil core 4 contacts the pole shoe 5 with an area, which has a contour complementary to that of the pole shoe 5, so that the coil core 4 contacts the pole shoe 5 virtually gap-freely. Pole shoe 5 includes for this purpose, for example, a second planar area 22 planparallel, in the unmounted state, with the first planar area 16. Coil core 4 lies with its complementary, planar area on the pole shoe 5 on the area 22. Pole shoe 5 is so embodied for measuring tube 1 that the second planar area 22 in the mounted state is also planar or complementary to the oppositely lying contour of the coil core 4.

If the pole shoe 5 lies tangent, for example, with its legs 17, to the circularly cylindrical lateral surface of the measuring tube 1 and lies, in such case, with its planar area 16 still not on the planar area 9 of the measuring tube 1, the prestress of the pole shoe 5 against the measuring tube 1 could produce a deformation of the pole shoe 5, for example, such that the first planar area 16 and therewith also the thereto planparallel, second planar area 22 experience a bending by an introduced bending stress, so that the second, originally planar area 22 assumes the shape of a simply or even doubly curved shell. A coil 3 with a coil core 4, which likewise has a planar area, with which it lies on the second, originally planar area 22, first of all, flushly, would in the mounted state, after the applying of the prestress and the therewith connected bending of the pole shoe 5, no longer contact the pole shoe 5 gap-freely. The force of the prestress plays, in such case, only a lesser role. More decisive is the embodiment of the pole shoe 5. Its dimensions are, consequently, so matched to the measuring tube 1 that, in the mounted state, when it, especially its planar area 16, contacts the planar area 9 of the measuring tube 1, it has a predetermined minimum separation from the otherwise cylindrical lateral surface of the measuring tube 1, thus does not contact the circularly cylindrical lateral surface of the measuring tube 1, or, in the limiting case, only lies tangent, for example, at two lines parallel to the measuring tube axis. Pole shoe 5 is constructed, for example, symmetrically, especially mirror symmetrically, with a mirror plane, in which the measuring tube axis lies and which intersects the planar area 9 of the measuring tube perpendicularly, and divides this, in such case, especially into two equally large parts.

Here, the pole shoe 5 includes, bordering on the planar area 16, 22, two legs 17, each of which has the same angle from the first planar area 16 and the same size. Alternatively, the pole shoe 5 can have e.g. also two circular arcs mounted on its planar area 16, 22.

Shown is, furthermore, another electrode 13, which protrudes from the measuring tube 1. Its longitudinal axis lies here in a plane parallel to the planar surfaces 9 of the measuring tube 1. In such case, involved are two measuring electrodes arranged in the measuring tube 1 and lying opposite one another. The field guide-back 7 surrounds the measuring tube 1 in the mounted state in at least one plane perpendicular to the measuring tube axis. In such case, also the measuring electrodes are surrounded. Both field guide-backs 7 can, in such case, overlap and be connected with one another, for example, by a screwed connection or an additional, resiliently acting, mounting clip. This increases the mechanical stability of the total system. As usual, the field guide-backs 7 surround the measuring tube 1 completely. The electrode 15 extending out from the planar area 9 of the measuring tube 1 is here, in contrast, not surrounded by the field guide-back 7. It is axially offset from the measuring electrodes and is externally shielded by the mounting clip 6 against mechanical influences, since such at least partially covers it on the side away from the measuring tube 1.

Not to be seen is that the measuring tube 1 has, in this further development of the invention, planparallel to the planar area 9, and therewith also parallel to the measuring tube axis, another planar area, against which a further magnet system 2 is prestressed. The second planar area lies on the oppositely lying side of the measuring tube 1. It is otherwise identical to the first planar area 9. Also, the two magnet systems 2 are equally constructed and produced, and are, thus, equally mounted. Because of the use of equal parts, such as e.g. coils, coil cores, pole shoes, field guide-backs and mounting clip, the magneto inductive, flow measuring device of the invention is cost effective to manufacture.

In a variant of the invention, the said components of the magnet system are embodied in such a way that they are also combinable with similarly constructed, however, differently sized, components of a building block system. Thus, different magnet systems for measuring tubes of different diameters or lengths can be manufactured simply and safely.

Another electrode can be provided for grounding. Alternatively, the grounding is effected via the flanges 10 and the mounting clip 6 contacting such, or, in an alternative embodiment, via the threaded pin 18 connected electrically conductively with the measuring tube.

Moreover, signal cable for contacting the measuring electrodes is led, for example, through the coil core of the coil.

Figure 2:
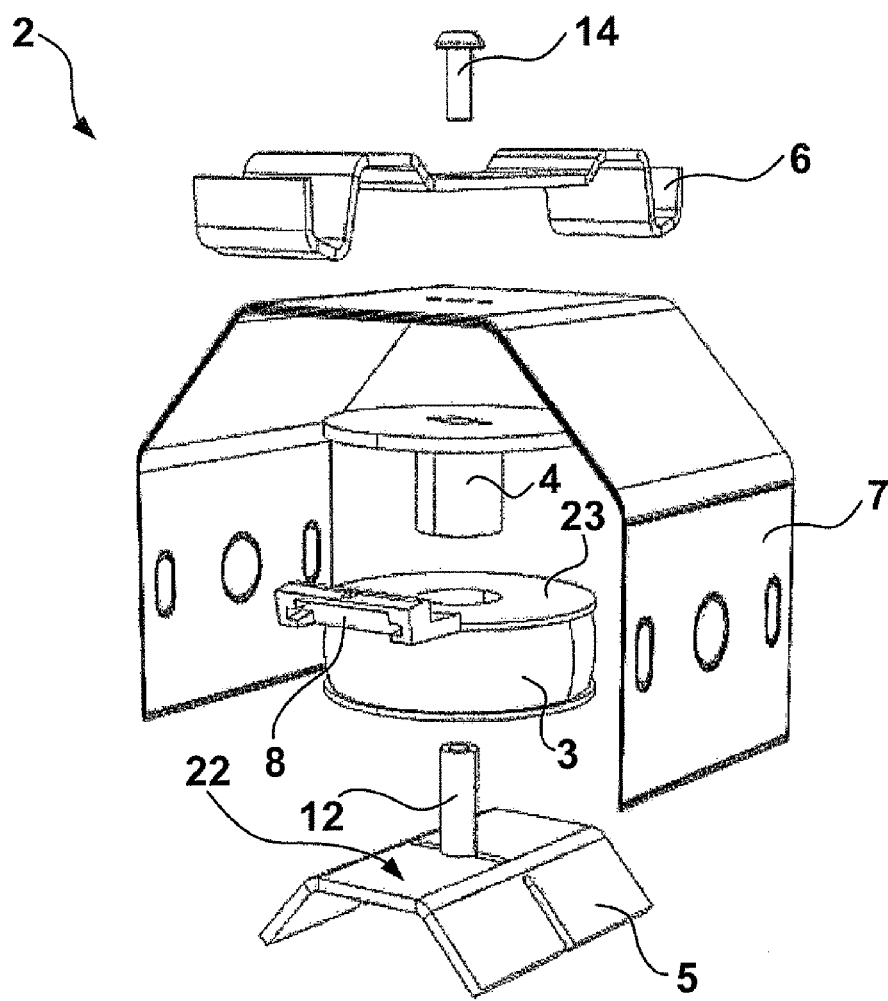
FIG. 2 shows the magnet system of a magneto inductive, flow measuring device of the invention in an exploded view.

FIG. 2 shows, perspectively, a magnet system 2 of the invention for a magneto inductive, flow measuring device of the invention. It includes a coil 3 and a pole shoe 5. In the illustrated example of an embodiment, it includes, supplementally, a coil core 4 and a field guide-back 7 and a screw 14. Quite usual is also a coil core as an integral component of the pole shoe. The coil 3 includes here a coil form 23, around which wire of electrically conductive material, e.g. copper wire, is wound. Arranged on the coil form 23 is a plug connector element 8 for the electrical connection of the coil 3. Plug connector element 8 is arranged in the mounted state between the mounting clip 6 and the measuring tube 1, and is, thus, protected against mechanical influences externally by the mounting clip, since it is at least partially shielded by this.

Pole shoe 5 includes a pin or, such as here, a socket with internal thread 12, by which the coil 3 and, in given cases, a coil core 4 can be applied. In the mounting, the pole shoe 5 is so oriented relative to the measuring tube 1 that the threaded socket 12 has a longitudinal axis, which coincides with a diameter of the measuring tube 1.

Pole shoe 5, coil 3 and coil core 4 are affixed by means of the screw 14, which is screwed into the threaded socket 12. Between coil 3, respectively coil core 4, and the head of the screw 14, the field guide-back 7 and the mounting clip 6 become clamped for producing the magnet system 2.

Figure 3:
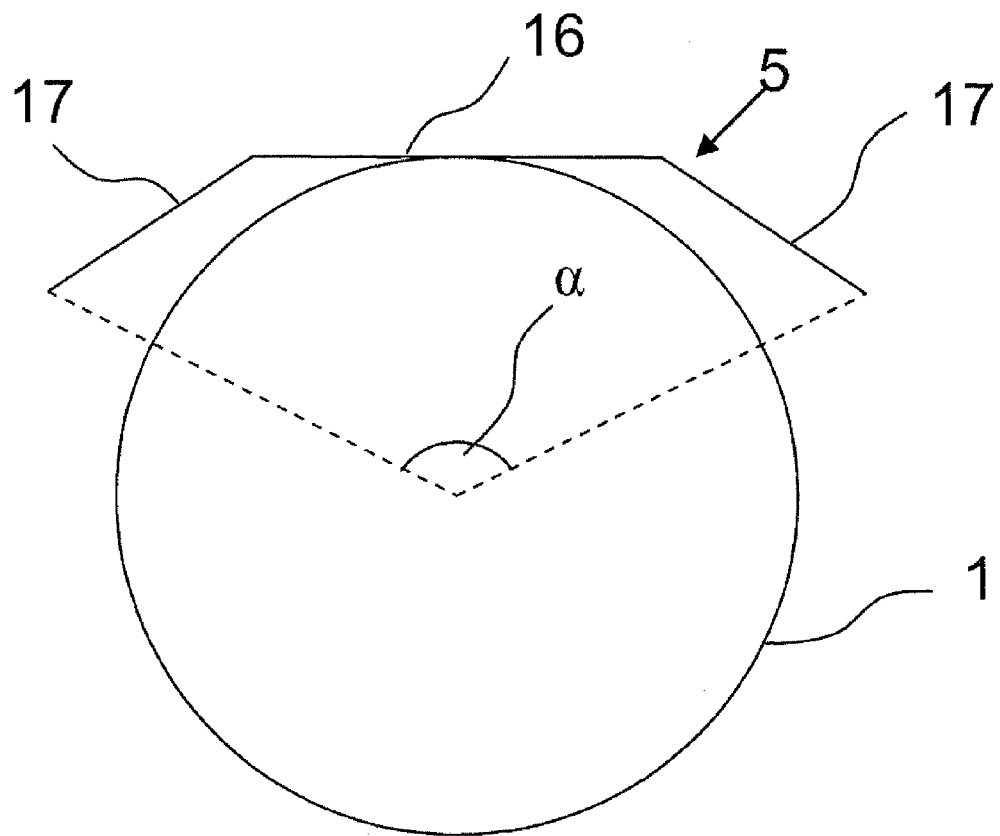
FIG. 3 shows in cross section, a magneto inductive, flow measuring device of the invention simplified in a sketch of principles.

Two lines, which lie in a plane perpendicular to the measuring tube axis, and which connect the measuring tube axis with the respective ends of the pole shoe 5, define a circular arc angle α. This is illustrated in the sketch of principles, as presented in FIG. 3, wherein the plane of the drawing is the plane perpendicular to the measuring tube axis, in which the two lines lie, which enclose the circular arc angle α. An imaginary symmetry plane (not shown) divides the circular arc angle, in turn, into two equally large parts, wherein the measuring tube axis lies in the symmetry plane. Here, the symmetry plane is a symmetry plane with regard to both the measuring tube 1 as well as also the pole shoe 5. Pole shoe 5 surrounds the measuring tube 1 with a circular arc angle α of 0° to 180°, typically of 10° to 120°. If a pole shoe 5 is, such as shown here, composed of three planar surfaces, the middle planar area of the pole shoe 5, which in the mounted state contacts the planar area of the measuring tube 1, surrounds the measuring tube 1 with a first circular arc angle of, for example, 10°, wherein then the entire pole shoe 5 surrounds the measuring tube 1 with a second circular arc angle of typically 15°.

The first angle, in such case, is between the two upturns (or downturns, depending on how one views it) on the two sides of the pole shoe, while the second is between the ends of the pole shoe. The first angle is, in such case, typically—however, not absolutely—at least as large as the angle subtended by the planar area 9 as defined from the measuring tube axis, wherein one considers for this the width of the planar area 9 perpendicular to the measuring tube longitudinal axis as a circular segment of the measuring tube cross section perpendicular to the measuring tube longitudinal axis. Instead of one angling, a number of other, incrementally angled upturns/downturns provide options or any curving of the pole shoe to surround the measuring tube partially and contoured with a predetermined minimum separation from the lateral surface of the measuring tube and a maximum separation limited, among other things, by the housing dimensions of the measuring transducer.

Figure 4:
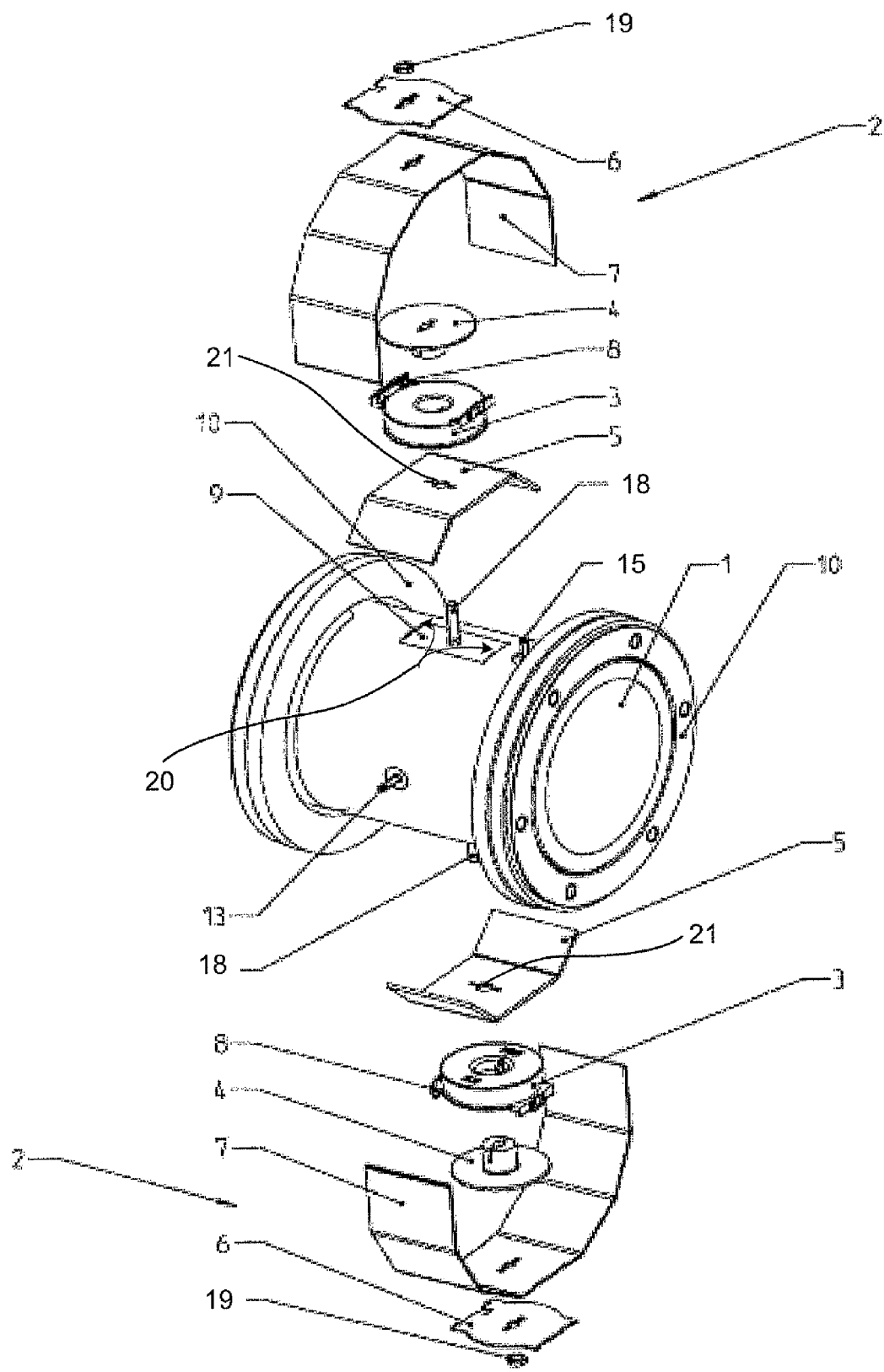
FIG. 4 shows a magneto inductive, flow measuring device of the invention in an additional embodiment.

FIG. 4 shows a further embodiment of a magneto inductive, flow measuring device of the invention. The planar area 9 includes, according to the illustrated embodiment, axial shoulders 20, so that the complementary magnet system 2, in the mounted state, rests against the axial shoulders 20. The planar area 9 extends, thus, not, such as above, over the total length of the measuring tube 1 between the two flanges 10. Here, the extent of the planar area in axial direction of the measuring tube 1, thus parallel to a longitudinal axis of the measuring tube 1, is limited by the circularly cylindrical outer contour of the measuring tube, whereby the two axial stops 20 are formed. Alternatively, also at least one axial stop, for example, in the form of a pin arranged on the planar area, can be provided on the planar area.

Pole shoe 5 has here additionally a length, which corresponds to the length of the planar area 9 in the axial direction of the measuring tube 1. Pole shoe 5, as part of the magnet system 2, is, thus, so formed for planar area 9, that it is embodied in the region bearing on the planar area 9 to be complementary to the planar area 9. In the mounted state, it can, thus, not be moved in the axial direction of the measuring tube 1 relative to the measuring tube 1. In the illustrated form of embodiment, the axial shoulders 20 function supplementally as twist preventers for the magnet system 2. By bearing against the shoulders 20, it cannot turn about an axis perpendicular to the planar area 9.

Protruding from the planar area 9 along this axis perpendicular to planar area 9 is a threaded pin 18, which is connected fixedly with the measuring tube 1. The magnet system is inserted onto the threaded pin 18 and then clamped with a nut 19 turned to a predetermined torque. Also, here, thus, the magnet system 2 is pressed with a predetermined force onto the measuring tube 1.

For this, the pole shoe 5 includes a bore 21, through which the threaded pin 18 is led. Also, the additional components or assemblies of the magnet system 2 are correspondingly formed. Thus, also the coil core and the field guide-back have corresponding bores. An essential difference compared to the above described example of an embodiment is, here, that the magnet system 2 is not separately assembled and mounted as an assembly on the measuring tube 1, but, instead, that the magnet system 2 is mounted on the measuring tube 1 and, thus, assembled first on the measuring tube 1.

By the provision of planar area 9 and pole shoe 5 embodied to be complementary to one another, the danger is decisively lessened in the mounting of the measuring device of the invention that parts not fitting one another might be used. The additional components of the magnet system 2 are likewise constructed corresponding to one another according to the idea of poka-yoke.

In an additional preferred variant of the invention, the coil core 4 and the pole shoe 5 are connected shape-interlocked with one another by a press fit.

Arranged around the coil core and over the pole shoe is the coil, preferably composed of a coil form and winding. The coil form can in a preferred embodiment be mounted with greater play in the direction of the longitudinal axis of the coil core, self-centered by the coil core. In this way, manufacturing tolerances can be advantageously absorbed.

The coil can supplementally also have detent means for accommodating, positioning and orientating the field guide-back 7 on the arrangement of pole shoe, coil and coil core.

The arrangement of pole shoe, coil, coil core and field guide-back can preferably be preassembled to a magnetic field producing module, which is secured by the screwed connection onto the measuring tube. The modular construction of this magnet apparatus reduces production effort, e.g. also in the case of mounting cables for signal transmission from the electrodes to the measurement transmitter through correspondingly provided openings for cable guidance in the interior of the field producing module In such case, the screwed connection can preferably be enabled via a single, centrally arranged, threaded pin, which is secured directly to the measuring tube, for example, by a welded connection. This reduces the number of degrees of freedom in comparison with a plurality of threaded pins. Furthermore, a higher symmetry of the construction is achieved with less effort, which affects measurement deviations advantageously. At the same time, an increased compression is achieved in the relevant region of the junction between guide-back and coil core, which to leads improved signal level and signal stability.

For as simple as possible handling, the screwed connection is led, in each case, preferably through the centers of the components of the magnet system, especially the coil, the coil core, the pole shoe and/or the field guide-back.

Alternatively or supplementally, the affixing can occur by the earlier described, mounting clip 6.

As already mentioned above, it especially advantageous, when the pole shoe of the magnet system is essentially sag and warp free, thus is secured without deformation on the measuring tube, so that no bending related air gaps arise between the pole shoe and the coil core. The free spaces would lead to a reduction of the sensitivity of the sensor and to a change of the size of the air gaps due e.g. to temperature fluctuations or vibrations, and this would lead to a change of measurement deviation.

The prestressing occurs in the case of the screwed connection by a direct connection between the measuring tube and the magnet system. In such case, a threaded bolt is connected fixedly with the measuring tube, for example, by welding.

The invention claimed is:

1. A magneto inductive flow measuring device, comprising:
   a measuring tube; and
   at least one magnet system arranged on said measuring tube, wherein:
   said measuring tube has at least one planar area and an otherwise cylindrical lateral surface, which border said measuring tube from its environment, against which planar area said magnet system is prestressed;
   said magnet system is prestressed against said planar area of said measuring tube by means of a screwed connection between said measuring tube and said magnet system and/or said magnet system is prestressed against said planar area of said measuring tube by means of a mounting clip, which is secured shape-interlocked to said measuring tube.

2. The magneto inductive flow measuring device as claimed in claim 1, wherein:
   said mounting clip engages in at least one cavity in a flange of said measuring tube.

3. The magneto inductive flow measuring device as claimed in claim 1, wherein:
   a plug connector element for electrical connection of said magnet system is arranged on said magnet system; and
   said plug connector element is arranged between said mounting clip and said measuring tube.

4. The magneto inductive flow measuring device as claimed in claim 1, wherein:
   said magnet system includes a pole shoe, a coil and a field guide-back sheet metal;
   said field guide-back sheet metal is arranged between said coil and said mounting clip; and
   said coil is arranged between said pole shoe and said field guide-back sheet metal.

5. The magneto inductive flow measuring device as claimed in claim 1, wherein:
   said magnet system includes a coil and a pole shoe;
   said coil includes a coil core;
   said pole shoe is prestressed with a predetermined force against the planar area of said measuring tube; and
   said coil core is prestressed with the same predetermined force against said pole shoe.

6. The magneto inductive flow measuring device as claimed in claim 1, wherein:
   said magnet system includes a pole shoe, which has a planar area, which transversely to a longitudinal axis of said measuring tube is wider than said planar area of said measuring tube.

7. The magneto inductive flow measuring device as claimed in claim 1, wherein:
   said magnet system includes a coil and a pole shoe;
   said pole shoe has a pin or a socket, on which said coil is inserted; and
   said pole shoe is oriented relative to said measuring tube such that said pin or said socket has a longitudinal axis, which coincides with a diameter of said measuring tube.

8. The magneto inductive flow measuring device as claimed in claim 1, wherein:
   said magnet system includes a pole shoe and a coil core, which coil core has a contour complementary to said pole shoe.

9. The magneto inductive flow measuring device as claimed in claim 4, wherein:
   an imaginary plane, in which the measuring tube axis lies and which intersects said planar area of said measuring tube perpendicularly, divides said planar area of said measuring tube into two equally large parts; and
   said pole shoe is constructed mirror symmetrically about the imaginary plane as a mirror plane.

10. The magneto inductive flow measuring device as claimed in claim 4, wherein:
    said pole shoe is so formed relative to said measuring tube that it contacts said planar area of said measuring tube and has a predetermined minimum separation relative to the otherwise cylindrical lateral surface of said measuring tube; and
    it surrounds said measuring tube with a circular arc angle of at least 10°.

11. The magneto inductive flow measuring device as claimed in claim 1, wherein:
    said planar area has in the axial direction of said measuring tube an axial shoulder for said magnet system.

12. The magneto inductive flow measuring device as claimed in claim 1, wherein:
    said measuring tube has, parallel to the measuring tube axis and planparallel to said planar area, another planar area, against which a further magnet system, especially an equally constructed magnet system, is prestressed.

13. A method for manufacturing a magneto inductive, flow measuring device, comprising: a measuring tube; and at least one magnet system arranged on said measuring tube, wherein: said measuring tube has at least one planar area and an otherwise cylindrical lateral surface, which border said measuring tube from its environment, against which planar area said magnet system is prestressed; said magnet system is prestressed against said planar area of said measuring tube by means of a screwed connection between said measuring tube and said magnet system and/or said magnet system is prestressed against said planar area of said measuring tube by means of a mounting clip, which is secured shape-interlocked to said measuring tube, comprising the steps of:
    providing a measuring tube having a circularly cylindrical shaped lateral surface is provided with a planar area, against which a magnet system is prestressed;
    prestressing the magnet system against the planar area of the measuring tube by means of a screwed connection between measuring tube and magnet system; and/or
    presstressing the magnet system against the planar area of the measuring tube by means of a mounting clip, which is secured shape-interlocked to the measuring tube.

14. The method as claimed in claim 13, wherein:
    a preassembly of the magnet system first occurs and then the preassembled magnet system is secured on the measuring tube by the mounting clip and/or a screwed connection.

* * * * *